(12) United States Patent
Huang et al.

(10) Patent No.: US 11,004,679 B2
(45) Date of Patent: May 11, 2021

(54) METHOD AND SYSTEM FOR SUPPLYING CHEMICAL LIQUID IN SEMICONDUCTOR FABRICATION

(71) Applicant: Taiwan Semiconductor Manufacturing Co., Ltd., Hsinchu (TW)

(72) Inventors: Wu-Hsing Huang, Hsinchu County (TW); Chia-Hung Kao, Budai Township, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 69 days.

(21) Appl. No.: 15/884,563

(22) Filed: Jan. 31, 2018

(65) Prior Publication Data

US 2019/0096665 A1    Mar. 28, 2019

Related U.S. Application Data

(60) Provisional application No. 62/563,805, filed on Sep. 27, 2017.

(51) Int. Cl.
*B05D 3/12* (2006.01)
*H01L 21/02* (2006.01)
(Continued)

(52) U.S. Cl.
CPC ........ *H01L 21/02282* (2013.01); *B05D 1/005* (2013.01); *G03F 7/0045* (2013.01);
(Continued)

(58) Field of Classification Search
CPC ......... H01L 21/02282; H01L 21/02164; H01L 21/6715; H01L 21/67253; H01L 21/0217; H01L 21/02532; H01L 21/30604; H01L 21/67259; H01L 21/67748; H01L 21/681; H01L 21/762; H01L 21/823821; H01L 29/6681; H01L 29/7853; B05D 1/005; G03F 7/0045; G03F 7/091; G03F 7/092; G03F 7/095; G03F 7/11; G03F 7/16; G03F 7/20
See application file for complete search history.

(56) References Cited

U.S. PATENT DOCUMENTS 4,542,710 A * 9/1985 Nakayama ............... B05C 9/08
118/302
5,392,989 A * 2/1995 Hurtig ...................... B05B 1/28
239/119

(Continued)

*Primary Examiner* — Kirsten Jolley
(74) *Attorney, Agent, or Firm* — McClure, Qualey & Rodack, LLP

(57) ABSTRACT

A method for dispensing photoresist over a semiconductor wafer is provided. The method includes moving a dispensing nozzle to a predetermined position where the longitudinal axis of the dispensing nozzle aligns with the central axis of the semiconductor wafer. The method further includes dispensing a chemical liquid over the semiconductor wafer via the dispensing nozzle. The method also includes dispensing a photoresist over the semiconductor wafer that is coated with the chemical liquid via the dispensing nozzle. During the dispensing of the chemical liquid and the photoresist, the dispensing nozzle stays in the predetermined position.

20 Claims, 9 Drawing Sheets

(51) Int. Cl.
<table>
<tr><td>G03F 7/09</td><td>(2006.01)</td></tr>
<tr><td>G03F 7/004</td><td>(2006.01)</td></tr>
<tr><td>G03F 7/095</td><td>(2006.01)</td></tr>
<tr><td>G03F 7/11</td><td>(2006.01)</td></tr>
<tr><td>G03F 7/20</td><td>(2006.01)</td></tr>
<tr><td>H01L 29/66</td><td>(2006.01)</td></tr>
<tr><td>H01L 21/306</td><td>(2006.01)</td></tr>
<tr><td>H01L 21/762</td><td>(2006.01)</td></tr>
<tr><td>H01L 29/78</td><td>(2006.01)</td></tr>
<tr><td>H01L 21/68</td><td>(2006.01)</td></tr>
<tr><td>H01L 21/677</td><td>(2006.01)</td></tr>
<tr><td>H01L 21/67</td><td>(2006.01)</td></tr>
<tr><td>G03F 7/16</td><td>(2006.01)</td></tr>
<tr><td>H01L 21/8238</td><td>(2006.01)</td></tr>
<tr><td>B05D 1/00</td><td>(2006.01)</td></tr>
</table>

(52) U.S. Cl.
CPC .............. *G03F 7/091* (2013.01); *G03F 7/092* (2013.01); *G03F 7/095* (2013.01); *G03F 7/11* (2013.01); *G03F 7/16* (2013.01); *G03F 7/20* (2013.01); *H01L 21/0217* (2013.01); *H01L 21/02164* (2013.01); *H01L 21/02532* (2013.01); *H01L 21/30604* (2013.01); *H01L 21/6715* (2013.01); *H01L 21/67253* (2013.01); *H01L 21/67259* (2013.01); *H01L 21/67748* (2013.01); *H01L 21/681* (2013.01); *H01L 21/762* (2013.01); *H01L 21/823821* (2013.01); *H01L 29/6681* (2013.01); *H01L 29/7853* (2013.01)

(56) References Cited

U.S. PATENT DOCUMENTS

<table>
<tr><td>6,416,583 B1 *</td><td>7/2002</td><td>Kitano ............... B05C 5/0216<br>118/301</td></tr>
<tr><td>8,796,666 B1</td><td>8/2014</td><td>Huang et al.</td></tr>
<tr><td>9,012,132 B2</td><td>4/2015</td><td>Chang</td></tr>
<tr><td>9,028,915 B2</td><td>5/2015</td><td>Chang et al.</td></tr>
<tr><td>9,093,530 B2</td><td>7/2015</td><td>Huang et al.</td></tr>
<tr><td>9,146,469 B2</td><td>9/2015</td><td>Liu et al.</td></tr>
<tr><td>9,213,234 B2</td><td>12/2015</td><td>Chang</td></tr>
<tr><td>9,223,220 B2</td><td>12/2015</td><td>Chang</td></tr>
<tr><td>9,256,133 B2</td><td>2/2016</td><td>Chang</td></tr>
<tr><td>9,536,759 B2</td><td>1/2017</td><td>Yang et al.</td></tr>
<tr><td>9,548,303 B2</td><td>1/2017</td><td>Lee et al.</td></tr>
<tr><td>2013/0236990 A1 *</td><td>9/2013</td><td>Sato ..................... H01L 22/20<br>438/5</td></tr>
</table>

* cited by examiner

METHOD AND SYSTEM FOR SUPPLYING CHEMICAL LIQUID IN SEMICONDUCTOR FABRICATION

PRIORITY CLAIM AND CROSS-REFERENCE

This application claims the benefit of U.S. Provisional Application No. 62/563,805, filed on Sep. 27, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

ICs are typically fabricated by processing one or more wafers as a "lot" with a series of wafer fabrication tools (i.e., "processing tools"). Each processing tool typically performs a single wafer fabrication task on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing).

Although existing processing tool have been generally adequate for their intended purposes, they have not been entirely satisfactory in all respects. Consequently, there is a need for a processing tool and method thereof that provides a solution for processing ICs efficiently and stably.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
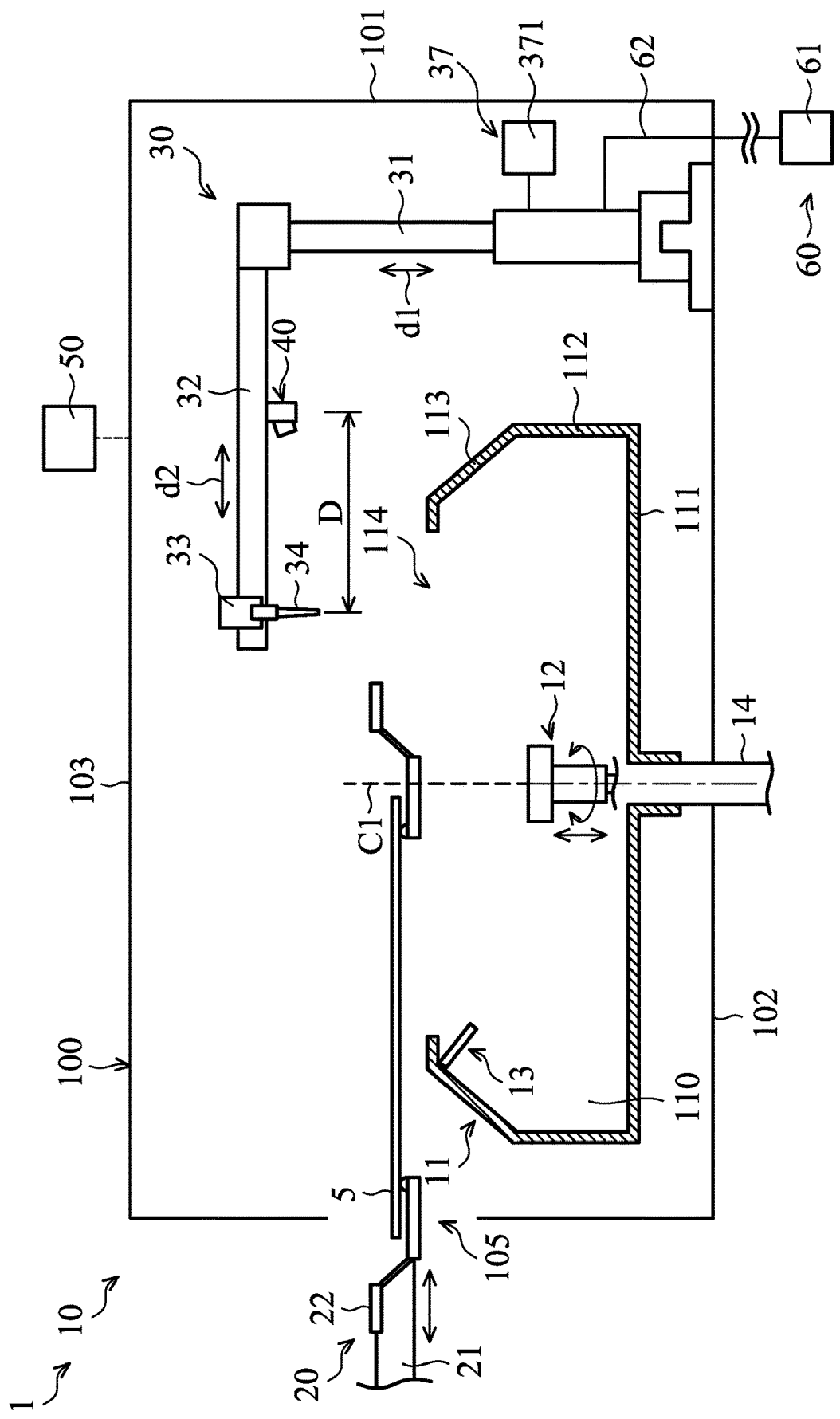
FIG. 1 is cross-sectional view of a wafer processing system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 2:
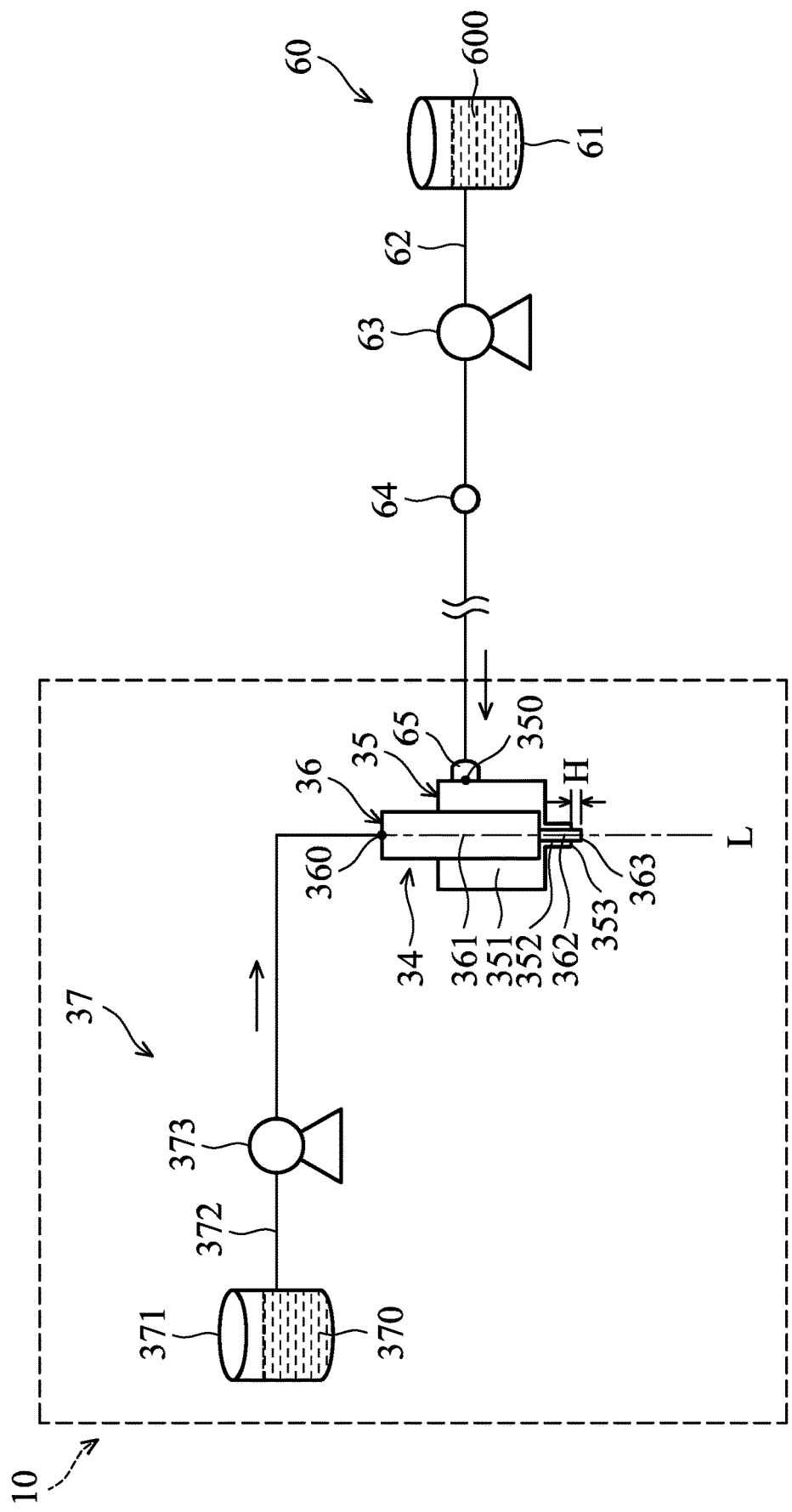
FIG. 2 is schematic view of partial elements of the wafer processing system, in accordance with some embodiments.

FIG. 1 is cross-sectional view of a wafer processing system 1 for processing a wafer 5, in accordance with some embodiments. FIG. 2 is schematic view of partial elements of the wafer processing system 1, in accordance with some embodiments. In some embodiments, the wafer processing system 1 is configured to coat a chemical liquid (such as a photoresist) on the semiconductor wafer 5 during a lithography process. In some embodiments, the wafer processing system 1 includes a processing chamber 10, a transferring module 20, a liquid dispensing module 30, an optical receiver 40, and a control module 50.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The processing chamber 10 has an interior space 100 defined by a number of walls, such as a lateral wall 101, a bottom wall 102, and a top wall 103. The lateral wall 101 is connected to edges of the bottom wall 102 and extends away from the bottom wall 102. The top wall 103 is connected to the distal end of the lateral wall 101. In some embodiments, the interior space 100 is secluded from the ambient environment. The interior space 100 communicates to the ambient environment via a slot 105 formed on the lateral wall 101. The slot 105 allows the transferring module 20 to pass through.

In some embodiments, the processing chamber 10 further includes a catch cup 11, a wafer stage 12, and an EBR (Edge Bead Removal) nozzle 13, in accordance with some embodiments. The catch cup 11, the wafer stage 12, and the EBR nozzle 13 are positioned in the interior space 100.

In some embodiments, the catch cup 11 is configured to provide an environment for depositing a photoresist film on the semiconductor wafer 5 and developing the exposed photoresist film deposited on the semiconductor wafer 5. The catch cup 11 is a circular cup having an open top 114. The upper portion 113 of the cup wall 112 tilts inward to facilitate retaining waste photoresist within the catch cup 11. The catch cup 11 is connected to an exhaust system via a liquid waste drain 14 formed on the bottom wall 102. As a result, the catch cup 11 is able to catch and drain waste liquid solution in a liquid film coating process via the liquid waste drain 14.

The wafer stage 12 is disposed in the catch cup 11. In some embodiments, the wafer stage 12 is configured for holding, positioning, moving, and otherwise manipulating the semiconductor wafer 5. In some embodiments, the wafer stage 12 is arranged to move along a rotation axis C1. The semiconductor wafer 5 may be secured on the wafer stage 12 by a clamping mechanism, such as vacuum clamping or e-chuck clamping. The wafer stage 12 is designed and configured to be operable for translational and rotational motions. In some embodiments, the wafer stage 12 is further designed to tilt or dynamically change the tilt angle. In some embodiments, the wafer stage 12 is fitted with a suitable heating mechanism to heat the semiconductor wafer 5 to the desired temperature.

In some embodiments, the EBR nozzle 13 is disposed in the catch cup 11. The EBR nozzle 13 is used to supply a liquid solution over the semiconductor wafer 5, when the semiconductor wafer 5 is disposed in the catch cup 11. The EBR nozzle 13 is connected to a source unit (not shown in figures) to receive the chemical liquid from the source unit.

The transferring module 20 includes one or more driving elements (not shown in figures), a robot arm 21, and a robot blade 22, in accordance with some embodiments. The driving element, such as a motor, is controlled by the control module 50 and is coupled to the robot arm 21. The robot arm 21 is driven by the driving element to provide both radial and rotational movement of the robot blade 22 in a fixed plane to pick up, transfer, and deliver the semiconductor wafer 5 from one location within the wafer processing system 1 to another.

For example, with the transferring module 20, the semiconductor wafer 5 is transferred between a carrier, such as a FOUP, and the processing chamber 10. In some other embodiments, the semiconductor wafer 5 is transferred between the processing chamber 10 and one or more processing chambers (not shown in figures) of the wafer processing system 1 by the transferring module 20.

The liquid dispensing module 30 includes a first drive mechanism 31, a second drive mechanism 32, a nozzle holder 33, a dispensing nozzle 34, a liquid supply unit 37 and a liquid supply unit 60, in accordance with some embodiments. For clarity, the liquid supply unit 60 is referred to as first liquid supply unit, and the liquid supply unit 37 is referred to as second liquid supply unit hereinafter.

One or more driving elements (not shown in figures), such as a motor, are controlled by the control module 50 and are coupled to the first drive mechanism 31 and the second drive mechanism 32. The driving element is used to actuate the first drive mechanism 31 to move in a vertical direction, as indicated by the arrow d1 shown in FIG. 1. Additionally or alternatively, the driving element is used to actuate the second drive mechanism 32 to move in a horizontal direction, as indicated by the arrow d2 shown in FIG. 1. In some embodiments, the first drive mechanism 31 is rotatable about a vertical axis.

The nozzle holder 33 is positioned at the liquid dispensing module 30 such that the nozzle holder 33 is moved into a particular position in the processing chamber 10. In some embodiments, the nozzle holder 33 is mounted at a distal end of the second drive mechanism 32. The nozzle holder 33 is used to hold the dispensing nozzle 34. The dispensing nozzle 34 is used to apply a chemical liquid to the semiconductor wafer 5.

Referring to FIG. 2, the dispensing nozzle 34 is connected the first liquid supply unit 60 and the second liquid supply unit 37 to receive chemical liquid from the first liquid supply unit 60 and the second liquid supply unit 37.

In some embodiments, the dispensing nozzle 34 includes an outer tube 35 and an inner tube 36. Both the outer tube 35 and the inner tube 36 extend along a longitudinal axis L of the dispensing nozzle 34, and the outer tube 35 has a greater width than the width of the inner tube 36 in a direction perpendicular to the longitudinal axis L. In addition, the outer tube 35 and the inner tube 36 are concentric with the longitudinal axis L, and the inner tube 36 is telescoped in the outer tube 35. As a result, there are two independent paths of flow in the dispensing nozzle 34. The first path of flow is defined by the inner tube 36, and the second path of flow is defined by a ring-shape gap which is formed between the outer tube 35 and the inner tube 36.

In some embodiments, the outer tube 35 and/or the inner tube 36, in a direction perpendicular to the longitudinal axis L, have varied widths. For example, the outer tube 35 includes a first wide portion 351 and a first narrow portion 352. The first wide portion 351 is fluidly connected to the first narrow portion 352, and the first wide portion 351 has a width greater than that of the first narrow portion 352. Therefore, the path of flow defined by the ring-shape gap which is formed between the outer tube 35 and the inner tube 36 has a varied width.

Alternatively or additionally, the inner tube 36 includes a second wide portion 361 and a second narrow portion 362. The second wide portion 361 is fluidly connected to the second narrow portion 362, and the second wide portion 361 has a width greater than that of the second narrow portion 362. Therefore, the path of flow defined by the inner tube 36 has a varied width.

In some embodiments, each of the outer tube 35 and the inner tube 36 has an inlet for receiving chemical liquid and an outlet port for dispensing chemical liquid from the inlet. For example, the outer tube 35 has an first inlet port 350 formed on a side wall of the first wide portion 351, and the outer tube 35 has a first outlet port 353 formed on a bottom wall of the first narrow portion 352. In addition, the inlet tube 36 has a second inlet port 360 formed on a top wall of the second wide portion 361, and the inlet tube 36 has a second outlet port 363 formed on a bottom wall of the second narrow portion 362.

In some embodiments, the second narrow portion 362 is surrounded by the first narrow portion 352. Therefore, a ring-shaped first outlet port 353 is formed. The ring-shaped first outlet port 353 is located farther away from the longitudinal axis L than the circular second outlet port 363 of the inner tube 36. In some embodiments, the width of the ring-shaped first outlet port 353 across the longitudinal axis L is sufficiently large so as to allow the first chemical liquid 600 to be dispensed.

In some embodiments, a portion of the inner tube 36 is exposed to the outside of the outer tube 35 and not surrounded by the outer tube 35. For example, as shown in FIG. 2, a portion of the inner tube 36 located approximate to the top wall, where the second inlet port 360 is formed, is exposed by the outer tube 35 and not surrounded by the outer tube 35. In addition, a portion of the inner tube 36 located approximate to the bottom wall, wherein the second outlet port 363 is exposed by the outer tube 35 and not surrounded by the outer tube 35. Therefore, the first outlet port 353 is positioned higher than the second outlet port 363, and there is a height difference H between the first outlet port 353 and the second outlet port 363.

In some embodiments, the second narrow portion 362 has a fixed width, but the first narrow portion 352 is tapered in a direction toward the first outlet port 353. Therefore, the width of the path of flow defined between the second narrow portion 362 and the first narrow portion 352 is gradually decreased in a direction toward the first outlet port 353. With such arrangements, the first chemical liquid 600 supplied from the first outlet port 353 is guided to flow along the outer wall of the second narrow portion 362, and most of the amount of first chemical liquid 600 passes through the edge of the second outlet port 363.

In some embodiments, the first liquid supply unit 60 includes a first tank 61, a first supply line 62, a first pump 63, an upstream pressure sensor 64 and a downstream pressure sensor 65. The first tank 61 is configured to store a chemical liquid 600 (referred to as first chemical liquid hereinafter). The first chemical liquid 600 may be a thinner or diluent and include a material selected from a group consisting of PGME, PGMEA, cyclohexanol, water solution, surfactant solution, and combinations thereof.

The first supply line 62 connects the first tank 61 to the dispensing nozzle 34. The first pump 63 is positioned on the first supply line 62 and configured for driving a flow of the first chemical liquid 600 from the first tank 61 to the first inlet port 350 of the dispensing nozzle 34. The first pump 63 may be electrically connected to the control module 50 (FIG. 1) and to receive control signals from the control module 50.

The upstream pressure sensor 64 is positioned on the first supply line 62 and located at downstream of the first pump 63. The upstream pressure sensor 64 is configured for detecting a pressure of the chemical liquid immediately discharged by the first pump 63. The upstream pressure sensor 64 may be electrically connected to the control module 50 (FIG. 1) to transmit signal associated with the pressure in the first supply line 62 to the control module 50.

In some embodiments, the first tank 600, the first pump 63 and the upstream pressure sensor 64 are positioned at the outside of the processing chamber 10. For example, the first tank 600, the first pump 63 and the upstream pressure sensor 64 are positioned at a facility system of a fabrication facility (FAB), and the chemical liquid contained in the first tank 600 is supplied to the processing chamber 10 via the first supply line 62.

In some embodiments, the downstream pressure sensor 65 is positioned on the first supply line 62 and connected to the first inlet port 350 of the outer tube 35. The downstream pressure sensor 65 is configured for detecting a pressure of the chemical liquid which is going to be supplied into the dispensing nozzle 34. The downstream pressure sensor 65 may be electrically connected to the control module 50 (FIG. 1) to transmit signal associated with the pressure at the first inlet port 350 to the control module 50.

In some embodiments, the second liquid supply unit 37 includes a second tank 371, a second supply line 372 and a second pump 373. The second tank 371 is configured to store a chemical liquid 370 (referred to as second chemical liquid hereinafter). The second chemical liquid 3700 may be a photoresist. In some embodiments, the photoresist is a positive photoresist which can also be said to have a positive photoresist tone. A portion of the positive photoresist that is exposed to light becomes soluble to photoresist developer, and the other portion of the positive photoresist that is unexposed to light remains insoluble to the photoresist developer. In some embodiments, the photoresist is a negative photoresist which can also be said to have a negative photoresist tone. A portion of the negative photoresist that is exposed to light becomes insoluble to the photoresist developer while the unexposed portion of the negative photoresist is dissolved by the photoresist developer. However, it should be appreciated that many variations and modifications can be made to the embodiments of the disclosure.

The second supply line 372 connects the second tank 371 to the dispensing nozzle 34. The second pump 373 is positioned on the second supply line 372 and configured for driving a flow of the second chemical liquid 370 from the second tank 371 to the second inlet port 360 of the dispensing nozzle 34. The second pump 373 may be electrically connected to the control module 50 (FIG. 1) and to receive control signals from the control module 50.

Referring back to FIG. 1, the optical receiver 40 is positioned at the liquid dispensing module 30 such that the optical receiver 40 can be moved to a particular position in the processing chamber 10. In some embodiments, the optical receiver 40 is mounted at the second drive mechanism 32. In some embodiments, the distance D between the nozzle holder 33 and the optical receiver 40 is approximately equal to the radius of the semiconductor wafer 5. In some embodiments, for the optical receiver 40 having a wide angle lens, the distance D is in a range from about 9 cm to about 15 cm. However, it should be appreciated that many variations and modifications can be made to embodiments of the disclosure.

The optical receiver 40 is used to investigate particular objects or locations in the processing chamber 10. In some embodiments, the optical receiver 40 includes a charge-coupled device (CCD). In some embodiments, an image processor (not shown in figured) is connected to the optical receiver 40 to receive the electronic signal from the optical receiver 40. Then the image processor analyzes the image to produce image information data regarding the image investigated by the optical receiver 40. The image processor may be integrated into the control module 50.

The control module 50 is configured to send control data to the transferring module 20 and the dispensing module 30. The transferring module 20 and the dispensing module 30 are operated according to the control data. In some embodiments, the control data from the control module 50 is related to the image information data from the image processor 42 and/or the pressure detected in the supply lines 372 and 62 (FIG. 2).

Figure 3:
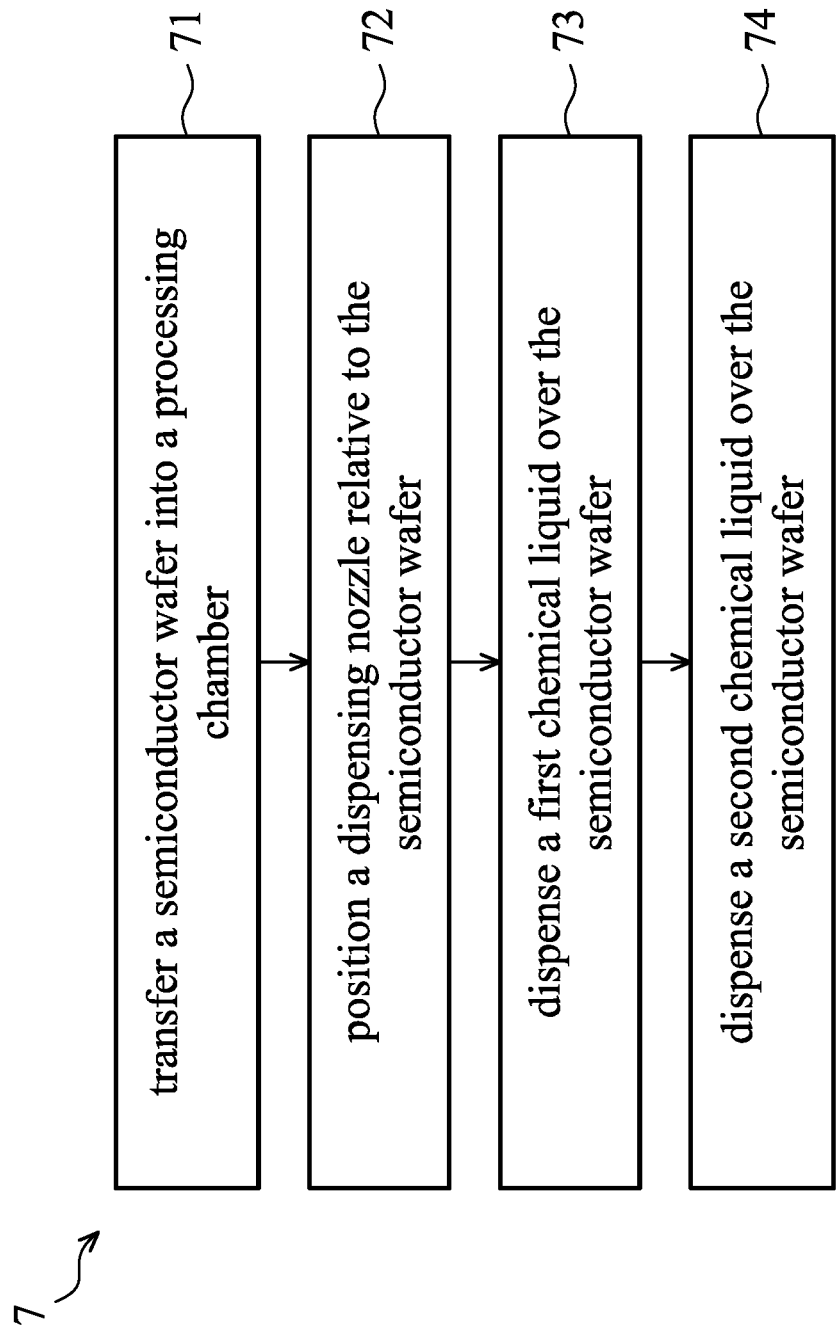
FIG. 3 is a flow chart of methods for dispensing chemical liquid over the semiconductor wafer, in accordance with some embodiments.

FIG. 3 is a flow chart illustrating a method for dispensing chemical liquid over the semiconductor wafer 5, in accordance with some embodiments. For illustration, the flow chart will be described in company with the schematic views shown in FIGS. 4-10. Some of the stages described can be replaced or eliminated for different embodiments. Additional features can be added in the semiconductor device structure. Some of the features described below can be replaced or eliminated for different embodiments.

Figure 4:
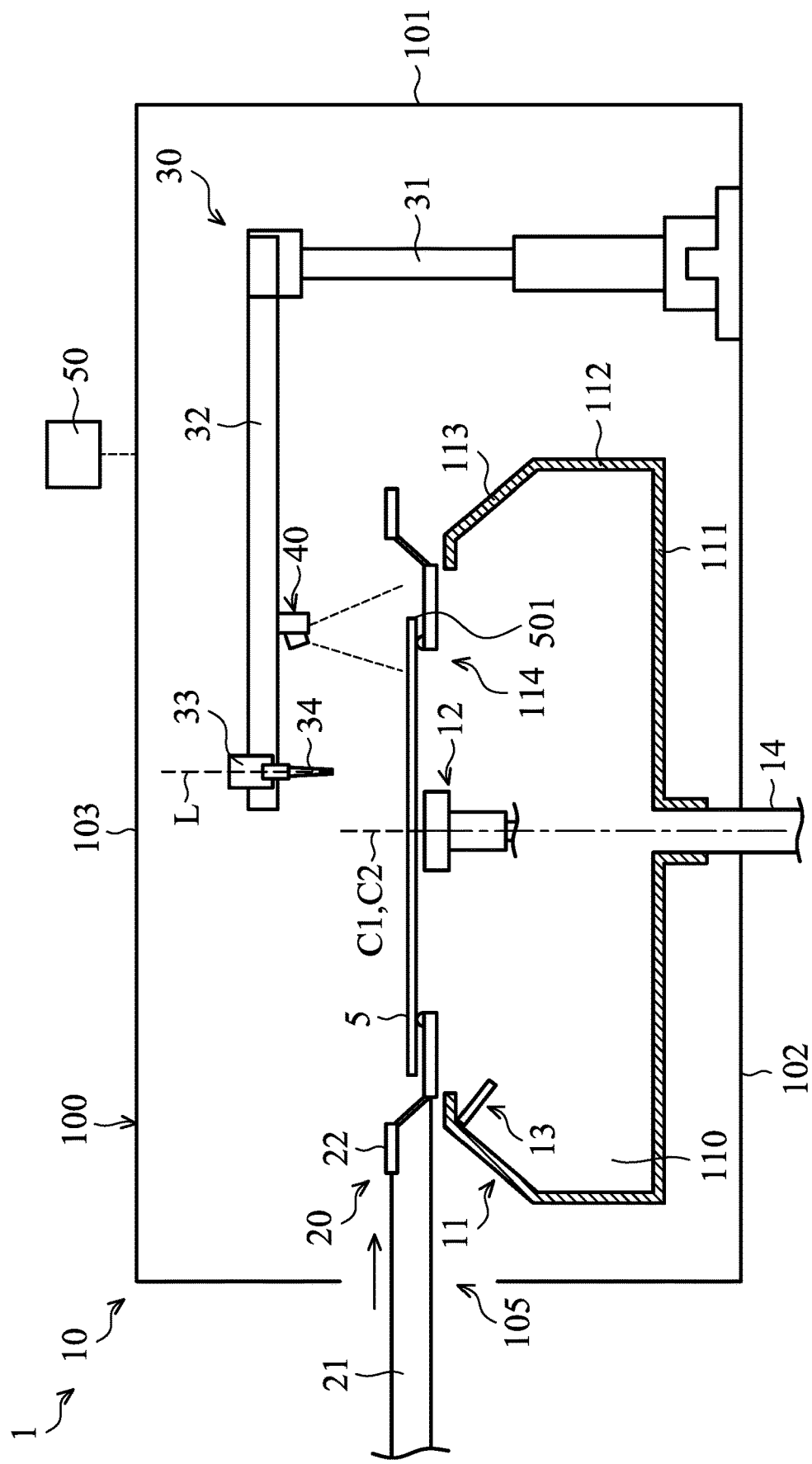
FIG. 4 is a cross-sectional view of one coating stage of a process for positioning a semiconductor wafer in a wafer processing system, in accordance with some embodiments.

The method 70 includes operation 71 in which semiconductor wafer 5 is transferred into the processing chamber 10 by the transferring module 20. In some embodiments, as shown in FIG. 4, the semiconductor wafer 5 is positioned by the transferring module 20 to align the central axis C2 of the semiconductor wafer 5 with the rotation axis C1 of the wafer stage 12.

The method 70 also includes operation 72 in which the dispensing nozzle 34 is positioned to align the longitudinal axis L of the dispensing nozzle 34 with the central axis C2 of the semiconductor wafer 5. In some embodiments, after operation 71, the dispensing nozzle 34 is transferred from a home position (not shown in figures) to a process position over the semiconductor wafer 5, as shown in FIG. 4. In some embodiments, when the dispensing nozzle 34 just reaches the top of the semiconductor wafer 5, the longitudinal axis L of the dispensing nozzle 34 is offset with the central axis C2 of the semiconductor wafer 5. In order to allow the dispensing nozzle 34 to be perfectly centered in relation to the semiconductor wafer 5, a position calibration process is performed.

In some embodiments, the position calibration process includes recording an image feature in relation to the semiconductor wafer 5. The image feature may be recorded by the optical receiver 40. The optical receiver 40 investigates an area corresponding to the edge 501 of the semiconductor wafer 5, and the image feature in relation to the semiconductor wafer 5 is delivered to the control module 50 or an image processor for analyzing.

The position calibration process may also include determining a shifting value for moving the dispensing nozzle 34 to align the center of the semiconductor wafer 5. The control module 50 may perform an image analysis to determine the shifting value for moving the dispensing nozzle 34 to align the center of the semiconductor wafer 5. The image analysis may include reading the real-time video image captured by the optical receiver 40. The image analysis may further include recognizing the position of the edge 501 of the semiconductor wafer 5 in the real-time image using a mathematical algorithm. In addition, the image analysis may include determining if the video image is overlapped with a template image which shows a reference line located at the correct position by matrix multiplication. If the edge 501 of the semiconductor wafer 5 is not in the correct position, the shifting value is calculated by the control module 50.

Figure 5:
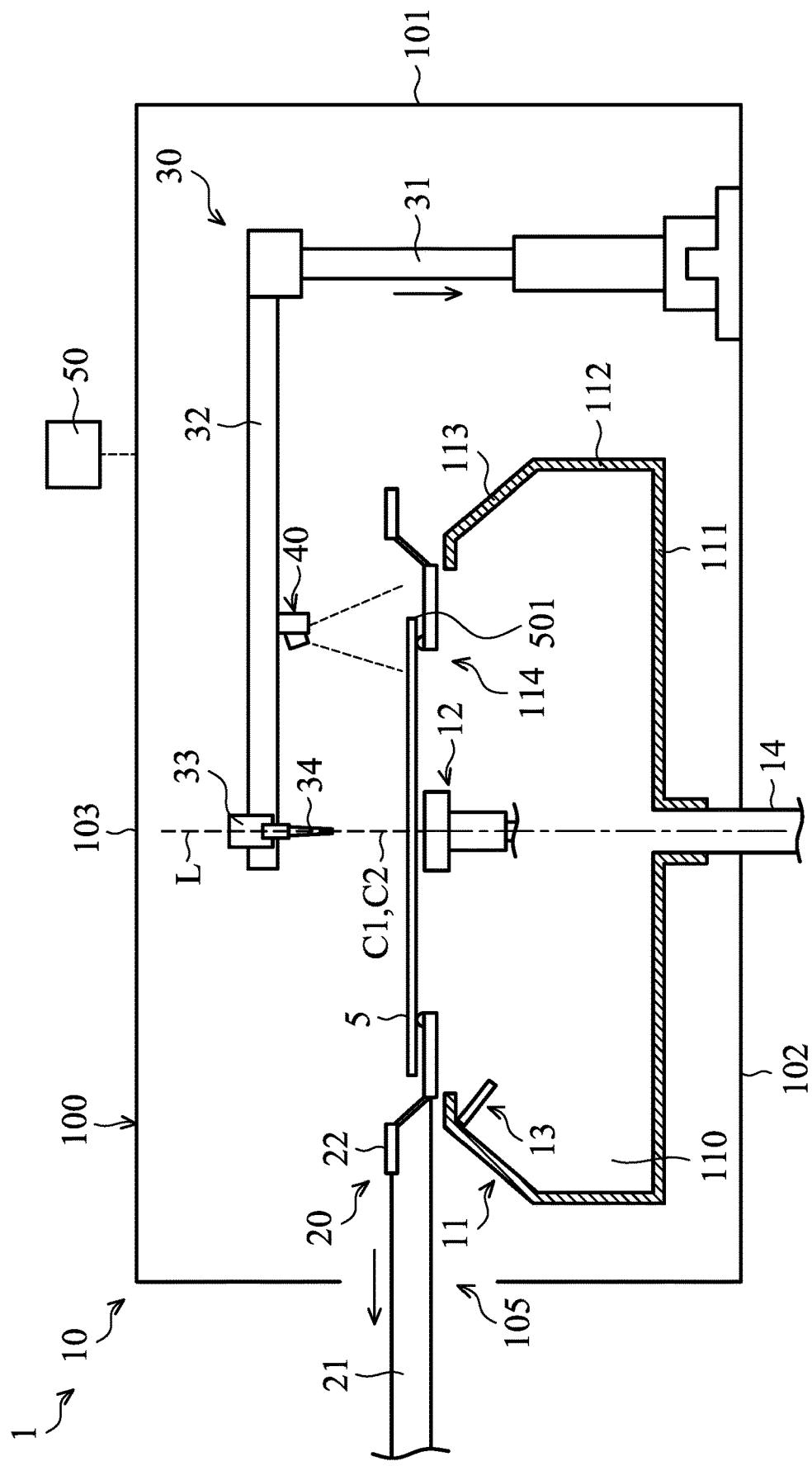
FIG. 5 is a cross-sectional view of one coating stage of a process for positioning a dispensing nozzle in a wafer processing system, in accordance with some embodiments.

The position calibration process may also include moving the dispensing nozzle 34 to a new position according to the calculated shifting value. Once the shifting value is determined, the control module 50 transmits data associated with the new position of the dispensing nozzle 34 to the first drive mechanism 31 and to a second drive mechanism 32. Afterwards, the first drive mechanism 31 and the second drive mechanism 32 move the dispensing nozzle 34 to the new position. After the position of the dispensing nozzle 34 is adjusted, the dispensing nozzle 34 is centered relative to the semiconductor wafer 5. Namely, the central axis C2 passes through the longitudinal axis L of the dispensing nozzle 34 as shown in FIG. 5.

Figure 6:
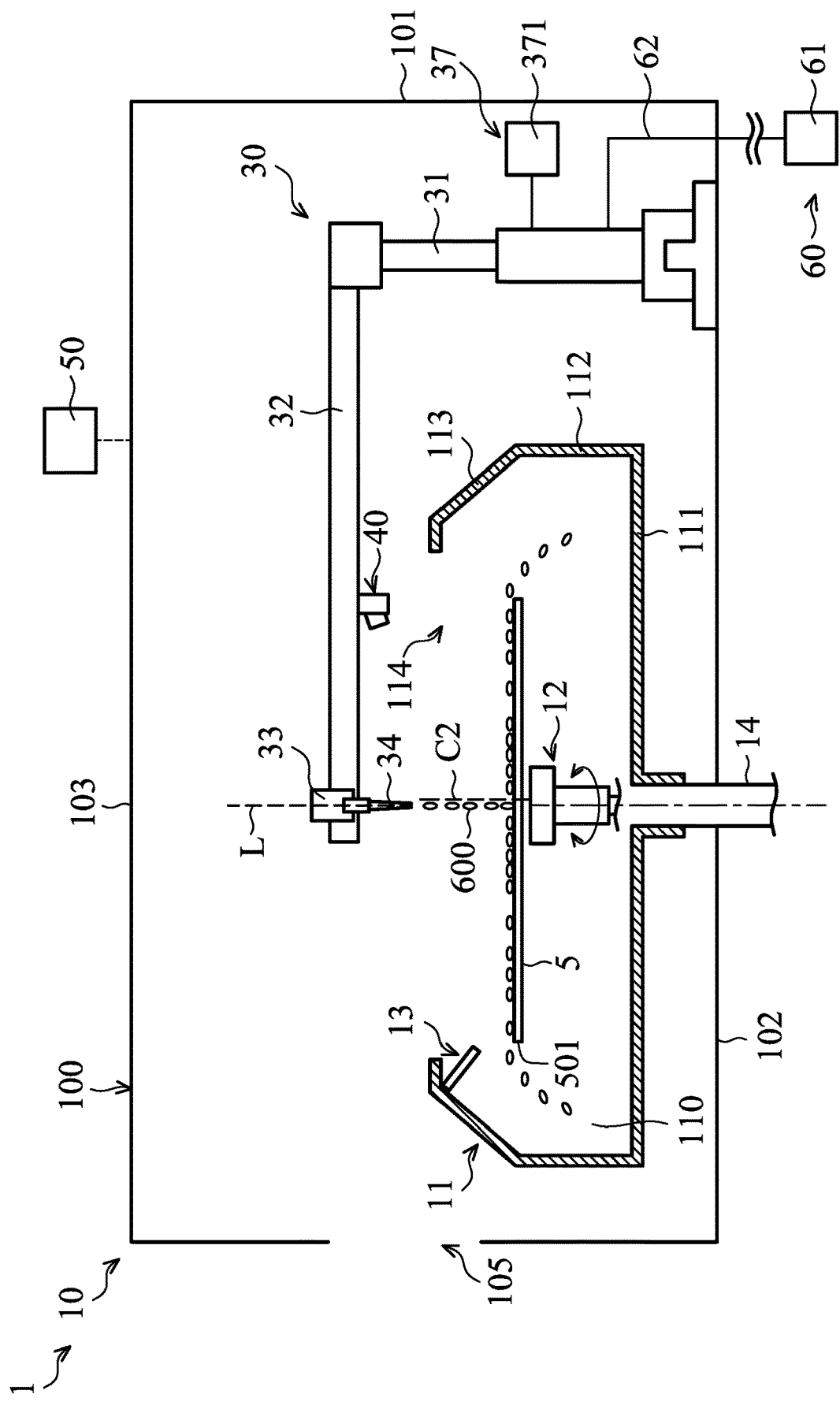
FIG. 6 is a cross-sectional view of one coating stage of a process for dispensing a chemical liquid over a semiconductor wafer, in accordance with some embodiments.

The method 70 also includes operation 73 in which the first chemical liquid 600 is dispensed over the semiconductor wafer 5 from the dispensing nozzle 34. As shown in FIG. 5, in operation 73, the wafer stage 12 lowers the semiconductor wafer 5 along the rotation axis C1, and the first drive mechanism 31 lowers the dispensing nozzle 34 along the rotation axis C1. Afterwards, as shown in FIG. 6, the first chemical liquid 600 contained in the first tank 61 is delivered to the dispensing nozzle 34 and dispensed over the center of the semiconductor wafer 5 in the catch cup 11 by the dispensing nozzle 34.

Figure 7:
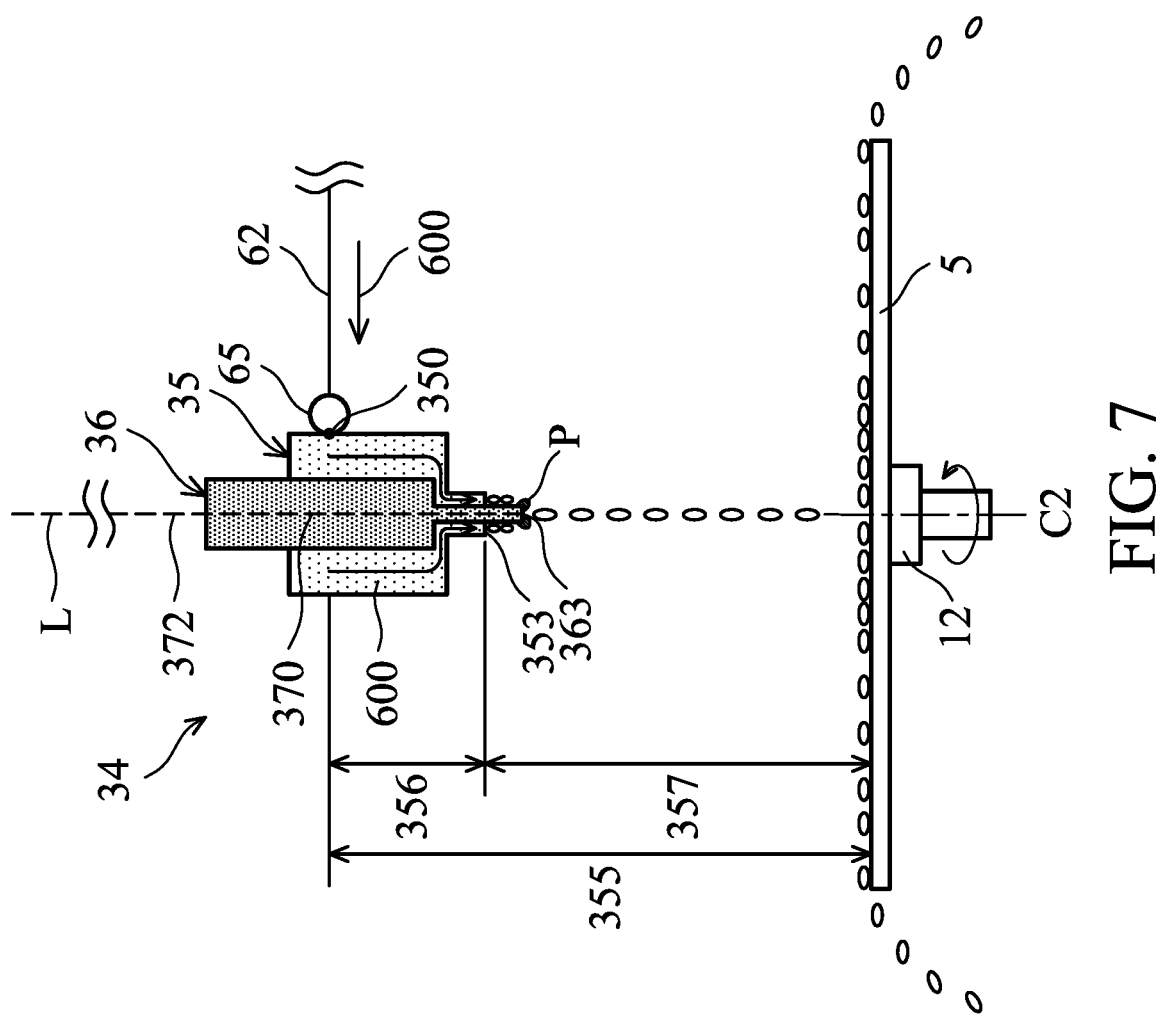
FIG. 7 is a schematic view of a dispensing nozzle as a chemical liquid is supplied via a first outlet port to a semiconductor wafer, in accordance with some embodiments.

Specifically, as shown in FIG. 7, the dispensing nozzle 34 dispenses the first chemical liquid 600 over the semiconductor wafer 5 via a first path of flow 355. The first path of flow 355 includes a first upstream segment 356 and a first downstream segment 357. The first upstream segment 356 is located in the dispensing nozzle 34 and extends from the first inlet port 350 to the first outlet port 353. The first downstream segment 357 is exposed to the outside of the dispensing nozzle 34. The first downstream segment 357 extends from the first outlet port 353 to the surface of the semiconductor wafer 5. The first downstream segment 357 is connected to the first upstream segment 356 via the first outlet port 353. In some embodiments, the first path of flow 355 passes through the edge of the second outlet port 363 of the inner tube 36.

In some embodiments, the first chemical liquid 600 is dispensed on the substantial center of the semiconductor wafer 5 by the dispensing nozzle 34. In addition, the substrate stage 12 simultaneously rotates the semiconductor wafer 5 at a rotational speed that is typically less than about 700 rpm.

In some embodiments, operations 71-73 are executed consecutively. Prior to the beginning of operation 71, the dispensing nozzle 34 is not located above the wafer stage 12 but remains in a home position for an idle time period. During the idle time period, the second chemical liquid 370 that remains at the edge of the second outlet port 363 is cured and transferred to the residue P, as shown in FIG. 7. The residue P may be formed at the edge of the second outlet port 363 and result in a clogging of the second outlet port 363 and cause the trajectory of the dispensing of the second chemical liquid 370 to be skewed.

In addition, these problems may adversely lead to an uneven photoresist on the semiconductor wafer 5 with one side of the wafer having an excessive photoresist coating and the other side of the wafer having insufficient photoresist coating. Such poor coverage of the photoresist coating on the wafer surface results in a high scrap rate of the devices formed on the semiconductor wafer 5, or even scrapping the whole semiconductor wafer 5.

However, thanks to the first outlet port 353 being higher than the second outlet port 363 relative to the semiconductor wafer 5, a portion of the first chemical liquid 600 that leaves the first outlet port 353 may flow along the outer wall of the inner tube 36 and pass through the edge of the second outlet port 363. As a result, the residue P of the chemical liquid 370 is removed by the chemical liquid 600. The residue P may react with the chemical liquid 600 to dissolve in the chemical liquid 600. Alternatively, the residue P may be removed from the dispensing nozzle 34 by a physical collision force by the chemical liquid 600 which is ejected from the first outlet port 353 at high pressure.

In some embodiments, a time period for the dispensing of the first chemical liquid 600 over the semiconductor wafer 5 is determined according to the detected pressure in the first supply line 62. Specifically, the downstream pressure sensor 65 detects the pressure of the first chemical liquid 600 in the end portion of the first supply line 62 which is immediately connected to the first inlet port 350. Afterwards, the signals associated the pressure is transmitted to the control module 50 (FIG. 6) and analyzed by the control module 50. In some embodiments, the control module 50 calculates the flow rate or flow amount of the first chemical liquid 600 based on the detected pressure. The time period required for dispensing the first chemical liquid 600 is determined by dividing a preset amount of first chemical liquid 600 over the semiconductor wafer 5 by the calculated flow rate or flow amount. With real-time pressure detection, the amount of first chemical liquid 600 dispensed on the semiconductor wafer 5 can be precisely controlled.

In some embodiments, the difference between the upstream pressure detected by the upstream pressure sensor 64 (FIG. 2) and the downstream pressure detected by the downstream pressure sensor 65 is calculated by the control module 50. When the difference between the upstream pressure and the downstream pressure is outside of a preset range, the control module 50 issues a signal to the first pump 63 to increase the pressure of the first chemical liquid 600.

Figure 8:
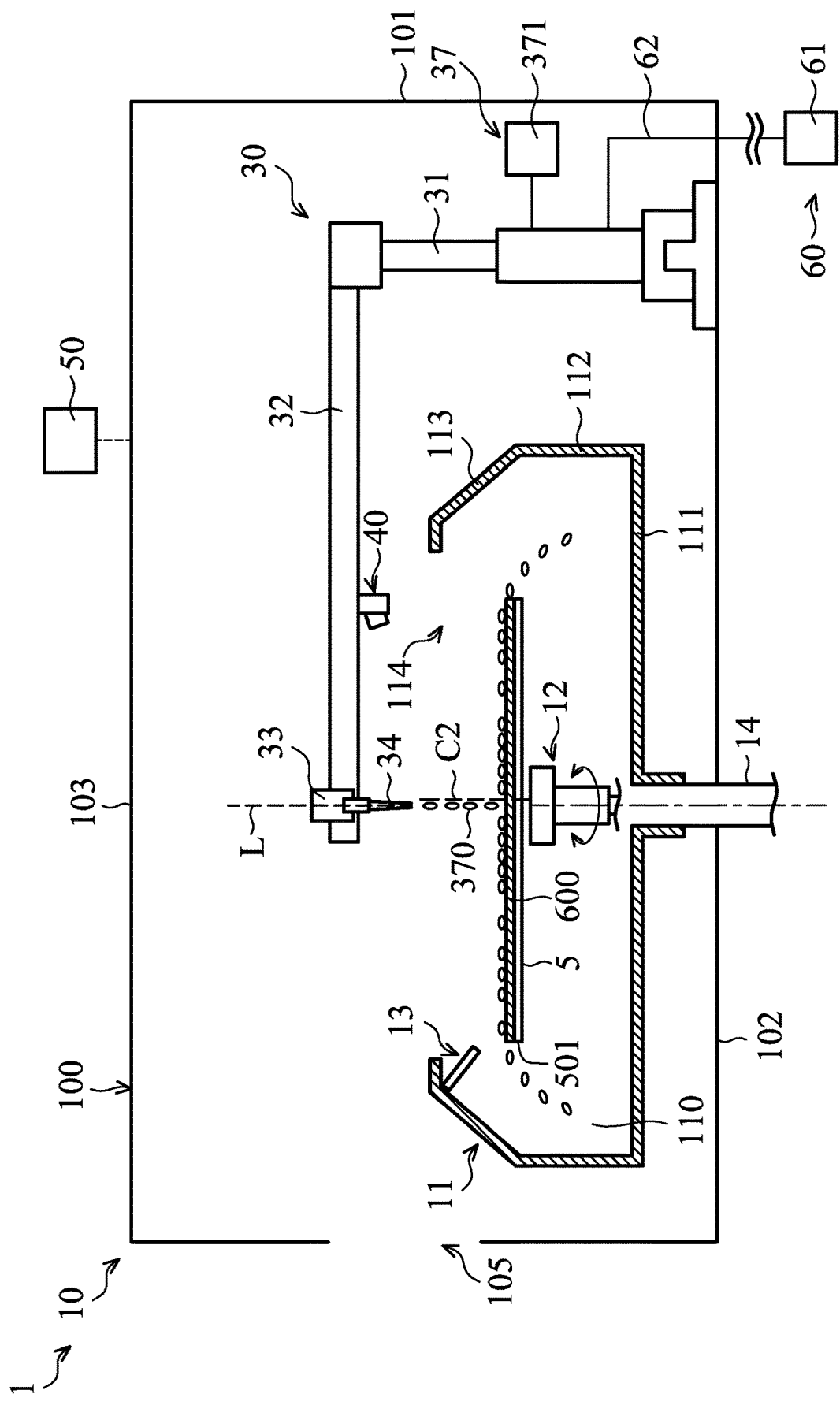
FIG. 8 is a cross-sectional view of one coating stage of a process for dispensing a photoresist over a semiconductor wafer, in accordance with some embodiments.

The method further includes operation 74, in which a second chemical liquid 370 is dispensed over the semiconductor wafer 5. In some embodiments, as shown in FIG. 8, the second chemical liquid 370 contained in the second tank 371 is delivered to the dispensing nozzle 34 and is dispensed over the center of the semiconductor wafer 5 in the catch cup 11 by the dispensing nozzle 34.

Figure 9:
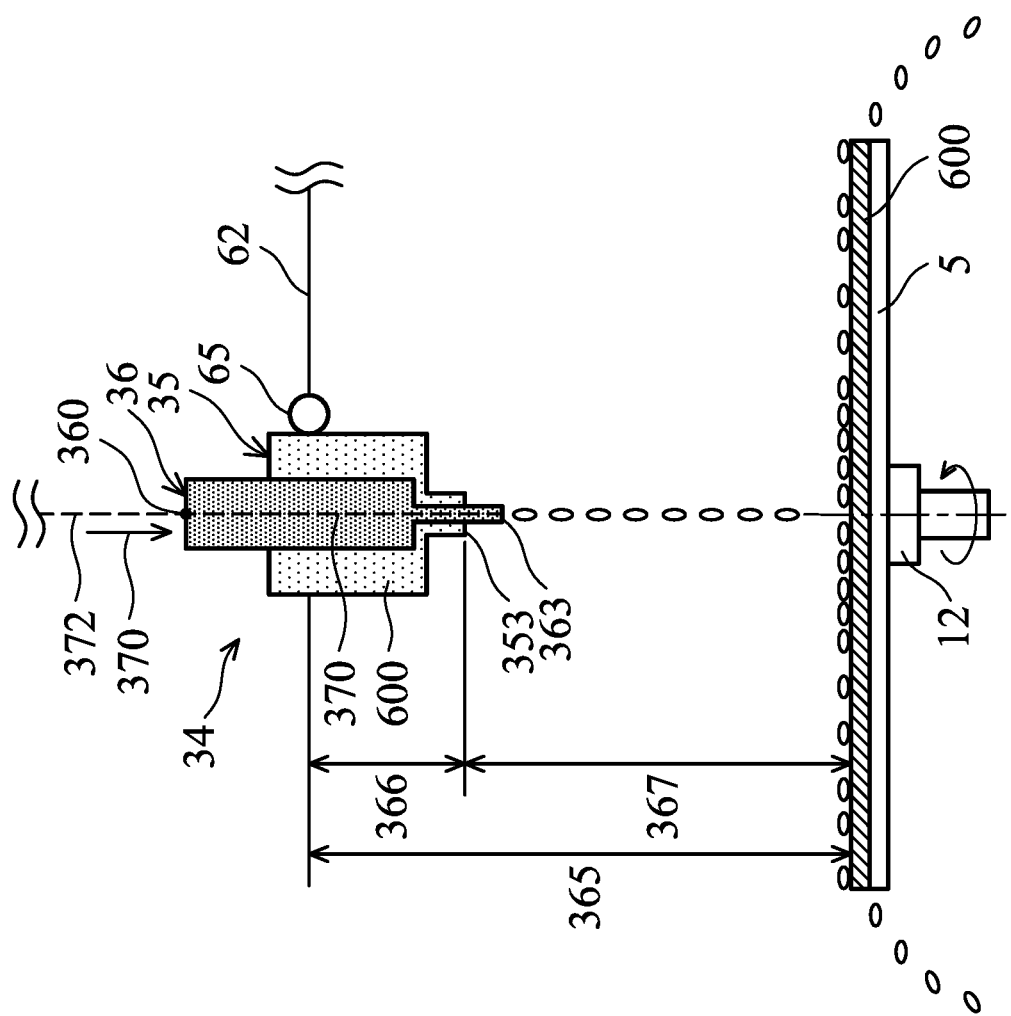
FIG. 9 is a schematic view of a dispensing nozzle as a photoresist is supplied via a first outlet port to a semiconductor wafer, in accordance with some embodiments.

Specifically, as shown in FIG. 9, the dispensing nozzle 34 dispenses the second chemical liquid 370 over the semiconductor wafer 5 via a second path of flow 365. The second path of flow 365 includes a second upstream segment 366 and a second downstream segment 367. The second upstream segment 366 is located in the dispensing nozzle 34 and extends from the second inlet port 360 to the second outlet port 363. The second downstream segment 367 is exposed to the outside of the dispensing nozzle 34. The second downstream segment 367 extends from the first outlet port 353 to the surface of the semiconductor wafer 5. The second downstream segment 367 is connected to the second upstream segment 366 via the second outlet port 363.

In some embodiments, the second chemical liquid 370 is dispensed on the substantial center of the semiconductor wafer 5 by the dispensing nozzle 34. In addition, the substrate stage 12 simultaneously rotates the semiconductor wafer 5 at a rotational speed that is typically less than about 700 rpm.

Referring to FIGS. 7 and 9, in some embodiments, the first downstream segment 357 of the first path of flow 355 converges with second downstream segment 367 of the second path of flow 365 at the second outlet port 363, and a portion of the first path of flow 355, which is located below the second outlet port 363, is overlapped with the second path of flow 365. With such arrangements, the residue P attached to the second outlet port 363 is efficiently removed.

In some embodiments, the dispensing nozzle 34 stays in place with the longitudinal axis L thereof aligning with the rotation axis C1 and the central axis C2 of the semiconductor wafer 5. That is, there is no need to shift the position of the dispensing nozzle 34 in the transition of operation 73 and operation 74. Therefore, operation 74 can be immediately performed after the end of operation 73. Alternatively, operation 74 can be initiated before the end of operation 73. Because the time needed for dispensing the chemical liquid 600 and 370 is shorter than the time used in other embodiments in which chemical liquid 600 and 370 are dispensed by two separate dispensing nozzles, the productivity of the wafer processing system 1 is increased.

After the photoresist coating process, the semiconductor wafer 5 is imaged in a stepper to reproduce the desired circuits on the wafer. A liquid developer material is then dispensed onto the surface of the semiconductor wafer 5. Since the photoresist layer is evenly coated on the semiconductor wafer 5, the process for developing the photoresist can be performed successfully.

Embodiments of a method and system implement a two-stage process to dispense two different chemical liquids over semiconductor wafer by the use of one single dispensing nozzle. Since the two chemical liquids are dispensed by the same dispensing nozzle, there is no need to align the dispensing nozzle again before the supply chemical liquid in the second stage, and this reduces the processing time. In addition, uneven coating of the chemical liquids due to misalignment can be mitigated or avoided. On the other hand, since the solvent provided in the second stage can be dissolved in the solvent provided in the first stage, the dispensing nozzles can be cleaned while the process is being carried out without stopping the operation of the processing system for nozzle replacement. As a result, the overall capacity increases and the manufacturing costs are reduced.

In accordance with some embodiments, a method for dispensing photoresist over a semiconductor wafer is provided. The method includes moving a dispensing nozzle to a predetermined position. At the predetermined position, the longitudinal axis of the dispensing nozzle is aligned with the central axis of the semiconductor wafer. The method also includes dispensing a chemical liquid over the semiconductor wafer via the dispensing nozzle. The method further includes dispensing a photoresist over the semiconductor wafer which is coated with the chemical liquid via the dispensing nozzle. During the dispensing of the chemical liquid and the photoresist, the dispensing nozzle stays in the predetermined position.

In accordance with some embodiments, a method for dispensing chemical liquid over a semiconductor wafer is provided. The method includes moving a dispensing nozzle having a first outlet port and a second outlet port over the semiconductor wafer. The method further includes dispensing a first chemical liquid over the semiconductor wafer via the first outlet port of the dispensing nozzle. The method also includes guiding the portion of the first chemical liquid dispensed from the first outlet port to an edge of the second outlet port before the first chemical liquid leaves the dispensing nozzle. In addition, the method includes dispensing a second chemical liquid over the semiconductor wafer via a second outlet port of the dispensing nozzle.

In accordance with some embodiments, a processing system for supplying chemical liquid over a semiconductor wafer is provided. The processing system includes a dispensing nozzle. The dispensing nozzle includes an outer tube and an inner tube. The outlet tube has a first inlet port and a first outlet port. The inner tube has a second inlet port and a second outlet port. The processing system further includes a first supply line. The first supply line is connected to the first inlet port and configured for supplying a first chemical liquid to the outer tube. The processing system further includes a second supply line. The second supply line is connected to the second inlet port and configured for supplying a second chemical liquid to the outer tube. The second outlet port is located farther away from a longitudinal axis of the dispensing nozzle than the first outlet port and is positioned higher than the first outlet port relative to the semiconductor wafer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for dispensing chemical liquid over a semiconductor wafer, comprising:
   moving a dispensing nozzle having a first outlet port and a second outlet port over the semiconductor wafer;
   supplying a first chemical liquid to the dispensing nozzle via a first inlet port;
   measuring a pressure of the first chemical liquid at the first inlet port;
   dispensing the first chemical liquid on the semiconductor wafer via the first outlet port of the dispensing nozzle, wherein a time period for the dispensing of the first chemical liquid on the semiconductor wafer is determined based on the measured pressure at the first inlet port of the dispensing nozzle;
   supplying a second chemical liquid that is a photoresist to be coated on the semiconductor wafer to the dispensing nozzle via a second inlet port;
   guiding the portion of the first chemical liquid dispensed from the first outlet port to an edge of the second outlet port to remove residue of the second chemical liquid before the first chemical liquid leaves the dispensing nozzle; and
   dispensing the second chemical liquid on the semiconductor wafer via the second outlet port of the dispensing nozzle after the end of dispensing the first chemical liquid.

2. The method as claimed in claim 1, wherein the first chemical liquid comprises a material selected from a group consisting of PGME, PGMEA, cyclohexanol, water solution, surfactant solution, and combinations thereof.

3. The method as claimed in claim 1, wherein the first outlet port is located farther away from a longitudinal axis of the dispensing nozzle than the second outlet port.

4. The method as claimed in claim 1, wherein the first outlet port is higher than the second outlet port relative to the semiconductor wafer.

5. The method as claimed in claim 1, wherein the dispensing nozzle is moved to a predetermined position where the longitudinal axis of the dispensing nozzle is aligned with a central axis of the semiconductor wafer, and the method further comprises:
   keeping the dispensing nozzle in the predetermined position during a time period after the dispensing of first chemical liquid and before the dispensing of the second chemical liquid.

6. The method as claimed in claim 1, further comprising curing the second chemical liquid on the edge of the second outlet port before the dispensing of the first chemical liquid.

7. A method for dispensing chemical liquid over a semiconductor wafer, comprising:
   providing a dispensing nozzle having a first outlet port and a second outlet port;
   supplying a first chemical liquid to the dispensing nozzle via a first inlet port;
   measuring a pressure of the first chemical liquid at the first inlet port;
   dispensing the first chemical liquid on the semiconductor wafer via the first outlet port of the dispensing nozzle, wherein a time period for the dispensing of the first chemical liquid on the semiconductor wafer is determined based on the measured pressure at the first inlet port of the dispensing nozzle;
   supplying a second chemical liquid that is a photoresist to be coated on the semiconductor wafer to the dispensing nozzle via a second inlet port after the end of dispensing the first chemical liquid;
   guiding the portion of the first chemical liquid dispensed from the first outlet port to an edge of the second outlet port to remove residue of the second chemical liquid before the first chemical liquid leaves the dispensing nozzle; and
   dispensing the second chemical liquid on the semiconductor wafer via the second outlet port of the dispensing nozzle after the end of dispensing the first chemical liquid.

8. The method as claimed in claim 7, wherein the first chemical liquid comprises a material selected from a group consisting of PGME, PGMEA, cyclohexanol, water solution, surfactant solution, and combinations thereof.

9. The method as claimed in claim 7, wherein the first outlet port is located farther away from a longitudinal axis of the dispensing nozzle than the second outlet port.

10. The method as claimed in claim 7, wherein the first outlet port is higher than the second outlet port relative to the semiconductor wafer.

11. The method as claimed in claim 7, further comprising:
moving the dispensing nozzle to a predetermined position where a longitudinal axis of the dispensing nozzle is aligned with a central axis of the semiconductor wafer before the dispensing of the first chemical liquid; and
keeping the dispensing nozzle in the predetermined position during a time period after the dispensing of first chemical liquid and before the dispensing of the second chemical liquid.

12. The method as claimed in claim 11, wherein the dispensing nozzle stays in the predetermined position during the dispensing of the first chemical liquid and the second chemical liquid.

13. A method for dispensing chemical liquid over a semiconductor wafer, comprising:
providing a dispensing nozzle, comprising:
an outer tube having a first outlet port; and
an inner tube having a second outlet port;
wherein the first outlet port is located farther away from a longitudinal axis of the dispensing nozzle than the second outlet port and is positioned higher than the second outlet port relative to the semiconductor wafer;
supplying a first chemical liquid to the dispensing nozzle via a first inlet port;
measuring a pressure of the first chemical liquid at the first inlet port;
dispensing the first chemical liquid on the semiconductor wafer via the first outlet port of the dispensing nozzle, wherein a time period for the dispensing of the first chemical liquid on the semiconductor wafer is determined based on the measured pressure at the first inlet port of the dispensing nozzle;
supplying a second chemical liquid that is a photoresist to be coated on the semiconductor wafer to the dispensing nozzle via a second inlet port;
guiding the portion of the first chemical liquid dispensed from the first outlet port to an edge of the second outlet port to remove residue of the second chemical liquid before the first chemical liquid leaves the dispensing nozzle; and
dispensing the second chemical liquid on the semiconductor wafer via the second outlet port of the dispensing nozzle after the end of dispensing the first chemical liquid.

14. The method as claimed in claim 13, wherein both the outer tube and the inner tube extend along the longitudinal axis of the dispensing nozzle, and the outer tube has a greater width than the width of the inner tube in a direction perpendicular to the longitudinal axis of the dispensing nozzle, wherein the outlet tube has a ring shape and the inner tube has a circular shape as observed in the direction parallel to the longitudinal axis of the dispensing nozzle.

15. The method as claimed in claim 13, wherein the outer tube and the inner tube, in a direction perpendicular to the longitudinal axis of the dispensing nozzle, have varied widths.

16. The method as claimed in claim 13, wherein the dispensing nozzle stays in a predetermined position where the longitudinal axis of the dispensing nozzle is aligned with a central axis of the semiconductor wafer during the dispensing of the first chemical liquid and the second chemical liquid.

17. The method as claimed in claim 16, further comprising:
moving the dispensing nozzle to the predetermined position before the dispensing of the first chemical liquid; and
keeping the dispensing nozzle in the predetermined position during a time period after the dispensing of first chemical liquid and before the dispensing of the second chemical liquid.

18. The method as claimed in claim 15, wherein the outer tube includes a first wide portion and a first narrow portion fluidly connected to the first wide portion, and the first narrow portion is closer to the first outlet port and has a smaller width than the first wide portion;
wherein the inner tube has a second wide portion and a second narrow portion fluidly connected to the second wide portion, and the second narrow portion is closer to the second outlet port and has a smaller width than the second wide portion;
wherein the second narrow portion is surrounded by the first narrow portion, and a portion of the second narrow portion located approximate to the second outlet portion is exposed to outside of the outer tube and not surrounded by the first narrow portion.

19. The method as claimed in claim 13, wherein a pressure sensor is connected to the first inlet port of the outer tube and configured to detect the pressure of the first chemical liquid which is going to be supplied into the dispensing nozzle.

20. The method as claimed in claim 13, wherein the second chemical liquid from the second outlet port is dispensed over the semiconductor wafer with the first chemical liquid thereon.

* * * * *